(12) United States Patent
Yu et al.

(10) Patent No.: US 10,553,824 B2
(45) Date of Patent: Feb. 4, 2020

(54) ENCAPSULATION COMPOSITION FOR ORGANIC ELECTRONIC DEVICE, AND ENCAPSULATION FORMED USING SAME

(71) Applicant: Momentive Performance Materials Korea Co., Ltd., Seoul (KR)

(72) Inventors: Sun Yu, Seoul (KR); Nan Soo Kim, Seoul (KR); Minjae Jeong, Seoul (KR); Sunaga Takeshi, Gunma (JP)

(73) Assignee: Momentive Performance Materials Korea Co., Ltd., Seoul (KR)

( * ) Notice: Subject to any disclaimer, the term of this patent is extended or adjusted under 35 U.S.C. 154(b) by 0 days.

(21) Appl. No.: 16/474,335

(22) PCT Filed: Dec. 20, 2017

(86) PCT No.: PCT/KR2017/015070
§ 371 (c)(1),
(2) Date: Jun. 27, 2019

(87) PCT Pub. No.: WO2018/124597
PCT Pub. Date: Jul. 5, 2018

(65) Prior Publication Data
US 2019/0341579 A1 Nov. 7, 2019

(30) Foreign Application Priority Data
Dec. 27, 2016 (KR) .................. 10-2016-0180095

(51) Int. Cl.
*H01L 51/52* (2006.01)
(52) U.S. Cl.
CPC ................ *H01L 51/5253* (2013.01)

(58) Field of Classification Search
None
See application file for complete search history.

(56) References Cited

U.S. PATENT DOCUMENTS

| | | |
|---|---|---|
| 6,451,870 B1 | 9/2002 | DeCato et al. |
| 2017/0352836 A1 | 12/2017 | Yu et al. |
| 2017/0362480 A1* | 12/2017 | Lu .................. C09J 183/06 |
| 2019/0048119 A1 | 2/2019 | Yu et al. |
| 2019/0194492 A1* | 6/2019 | Yu .................. C09D 183/10 |

FOREIGN PATENT DOCUMENTS

| | | |
|---|---|---|
| JP | 2014-001341 A | 1/2014 |
| KR | 10-2016-0093560 A | 8/2016 |
| WO | 2016/141546 A1 | 9/2016 |
| WO | 2017-196087 A1 | 11/2017 |

* cited by examiner

*Primary Examiner* — Jack S Chen
(74) *Attorney, Agent, or Firm* — Nelson Mullins Riley & Scarborough LLP; Kongsik Kim

(57) ABSTRACT

The present invention relates to a composition for an organic electronic device encapsulant and an encapsulant formed by using the same. A composition for an encapsulant according to an exemplary embodiment of the present invention comprises: 1) a first copolymer comprising the first unit represented by Chemical Formula 1, the second unit represented by Chemical Formula 2, and the third unit represented by Chemical Formula 3; 2) a second copolymer comprising the second unit represented by Chemical Formula 2 and the third unit represented by Chemical Formula 3; 3) one or more photoinitiators; 4) a reactive silicone-based oligomer; and 5) a silicone acrylate-based compound.

12 Claims, No Drawings

ENCAPSULATION COMPOSITION FOR ORGANIC ELECTRONIC DEVICE, AND ENCAPSULATION FORMED USING SAME

CROSS-REFERENCES TO RELATED APPLICATIONS

This application is a U.S. national phase application, pursuant to 35 U.S.C. § 371, of PCT/KR2017/015070, filed Dec. 20, 2017, designating the United States, which claims priority to Korean Application No. 10-2016-0180095, filed Dec. 27, 2016. The entire contents of the aforementioned patent applications are incorporated herein by this reference.

TECHNICAL FIELD

The present invention relates to a composition for an organic electronic device encapsulant and an encapsulant formed by using the same.

BACKGROUND ART

In general, organic electronic devices are devices characterized in that a phenomenon such as light emission or a flow of electricity occurs when charges are injected into an organic layer provided between a positive electrode and a negative electrode, and it is possible to manufacture a device which serves various functions according to the organic material selected.

As a representative example, organic light emitting diodes (OLEDs) have drawn attention in the next-generation flat panel display field, the flexible display field, the lighting field, and the like because the OLEDS are thin and lightweight and have excellent color impression, and may be manufactured on a glass substrate, an inorganic material substrate comprising silicon, a metal substrate, and a flexible substrate such as a plastic substrate or a metal foil in the related art. These organic electronic devices are extremely vulnerable to moisture and oxygen and thus have a disadvantage in that light emitting efficiency and a service life are significantly reduced when the devices are exposed to the air or when moisture is introduced into the inside of a panel from the outside.

The encapsulation technology is an essential process for preventing oxidation of a light emitting material and an electrode material by blocking moisture and oxygen introduced from the outside of an OLED, and furthermore, for protecting the device from mechanical and physical impacts applied from the outside of the device.

In order to solve the aforementioned problem, attempts have been made to block moisture and oxygen introduced from the outside by using an encapsulant film using a glass cap or a metal cap or a laminating method or depositing inorganic materials.

However, the glass cap has disadvantages in that costs caused by glass processing are increased due to implementing a large area of a panel, and there is a problem with implementing a large area thereof due to mechanical damage, and the like, and also has difficulties in manufacturing a flexible OLED panel which requires flexibility. The metal cap has a problem with a process caused by a difference in thermal expansion coefficient between the metal cap and a substrate. Further, a bonding film using the laminating method has a problem in that moisture and oxygen are introduced through an interface with a bonding surface of the film.

Furthermore, when using a metal cap method in which a moisture absorbent is provided inside a panel during the encapsulation of the organic electronic device, an extension portion which protrudes at a predetermined height is formed in a metal cap structure for using a moisture absorbent, and when the metal cap is lastly bonded to a substrate using a bonding agent, or an organic light emitting diode is encapsulated by processing glass to form a glass cap, a method of bonding the metal cap to the substrate by using a method, such as sand blast or etching, to provide a moisture absorbent inside a predetermined groove is used. The method in the related art makes it difficult to process the metal cap due to an expansion of a space inside the encapsulation when a panel becomes large, and may cause a problem in that the glass cap is easily broken by external pressure.

There is a need for developing a new encapsulation technology which is different from the existing encapsulation process due to these difficulties.

DISCLOSURE

Technical Problem

The present invention has been made in an effort to provide a composition capable of preparing an encapsulant which may improve a service life of an organic electronic device and effectively block oxygen and moisture, and the like, which are introduced from the outside, and an encapsulant using the same.

Technical Solution

An exemplary embodiment of the present invention provides a composition for an encapsulant, the composition comprising:

1) a first copolymer comprising a first unit represented by the following Chemical Formula 1, a second unit represented by the following Chemical Formula 2, and a third unit represented by the following Chemical Formula 3;

2) a second copolymer comprising the second unit represented by the following Chemical Formula 2 and the third unit represented by the following Chemical Formula 3;

3) one or more photoinitiators;

4) a reactive silicone-based oligomer; and 5) a silicone acrylate-based compound.

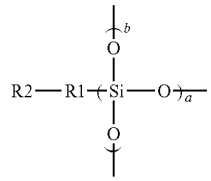

[Chemical Formula 1]

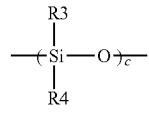

[Chemical Formula 2]

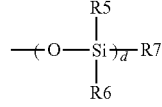

[Chemical Formula 3]

In Chemical Formulae 1 to 3,

R1 is a direct bond, or an alkylene group,

R2 to R7 are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, c, and d are each independently 1 to 200.

Further, another exemplary embodiment of the present invention provides an encapsulant using the composition for an encapsulant.

Advantageous Effects

The composition for an encapsulant according to an exemplary embodiment of the present invention is characterized in that it is possible to manufacture an encapsulant which may improve a service life of an organic electronic device, and effectively block oxygen and moisture and the like, which are introduced from the outside.

Further, the composition for an encapsulant according to an exemplary embodiment of the present invention has a characteristic of improving the sensitivity of an encapsulant using the composition for an encapsulant by introducing a novel organopolysilicone-based resin such as a first copolymer.

In particular, the composition for an encapsulant according to an exemplary embodiment of the present invention has effects of improving the sensitivity during the UV curing of the composition and lowering the modulus of a finally cured product by comprising a silicone acrylate-based compound represented by Chemical Formula 6.

BEST MODE FOR CARRYING OUT THE INVENTION

Hereinafter, the present application will be described in detail.

Organic EL devices are polycrystalline semiconductor devices, and are used for a liquid crystal backlight, and the like in order to obtain light emission with high brightness at low voltage, and expected as a thin-type flat display device. However, there are problems in that organic EL devices are extremely vulnerable to moisture, an interface between a metal electric field and an organic EL layer may be peeled off due to the effects of moisture, the resistance may be increased due to the oxidation of metal, and organic materials may change in quality by moisture, and as a result, the organic EL devices do not emit light, and brightness thereof may deteriorate.

In order to solve the problems, methods for encapsulating an organic EL device have been developed. As the existing encapsulation methods, in an organic EL device, there have been usually used a method of melting frit glass between a substrate and an upper glass plate by means of laser and bonding and hermetically sealing the edges of the two substrates, and a system of inserting a moisture absorbent or a filler between a sealed glass plate and an organic EL device to remove moisture thereinside or increase mechanical strength as a system of bonding the edge between a sealed glass plate and an organic EL substrate by using a sealant.

However, an encapsulation technology using frit glass is a system usually used in a small organic EL device, and a system of bonding the edge of a sealed glass plate by using a sealant has disadvantages in that the strength is reduced and there occurs a warpage phenomenon during a high heat process because there is an empty space between an organic EL device and a glass plate. It is difficult to introduce the encapsulation method into the manufacturing of a flexible organic EL panel, which requires the enlargement and flexibility of the organic EL device.

The present invention has been made in an effort to provide a curable encapsulant composition, which may prepare an encapsulant capable of improving a service life of an organic electronic device and effectively blocking oxygen and moisture, and the like, which are introduced from the outside, and may have process stability when a post-process is performed by introducing a curable system, and an encapsulant using the same.

In particular, the composition for an encapsulant according to an exemplary embodiment of the present invention has effects of improving the sensitivity during the UV curing of the composition and lowering the modulus of a finally cured product by comprising a silicone acrylate-based compound represented by Chemical Formula 6.

A composition for an encapsulant according to an exemplary embodiment of the present invention comprises: 1) a first copolymer comprising the first unit represented by Chemical Formula 1, the second unit represented by Chemical Formula 2, and the third unit represented by Chemical Formula 3; 2) a second copolymer comprising the second unit represented by Chemical Formula 2 and the third unit represented by Chemical Formula 3; 3) one or more photoinitiators; 4) a reactive silicone-based oligomer; and 5) a silicone acrylate-based compound.

In the present invention, the first copolymer is characterized by comprising: the first unit represented by Chemical Formula 1; the second unit represented by Chemical Formula 2; and the third unit represented by Chemical Formula 3.

In general, a resin in which two oxygen atoms are bonded to one silicone atom in a silicone-based resin refers to a D-type silicone-based resin, and a resin in which three oxygen atoms are bonded to one silicone atom in a silicone-based resin refers to a T-type silicone-based resin. In the related art, the D-type silicone-based resin or the T-type silicone-based resin has been each independently used, or the D-type silicone-based resin and the T-type silicone-based resin have been used by being mixed with each other. However, a silicone-based resin such as the first copolymer according to the present invention is not a mixture of the D-type silicone-based resin and the T-type silicone-based resin as in the related art, but a silicone-based resin which comprises both D-type and T-type in the silicone-based resin and is different from that in the related art.

An exemplary embodiment of the present invention is characterized in that suitable strength of an encapsulant thin film may be obtained and the sensitivity may be improved during a curing process of a composition for an encapsulant, by comprising both D-type and T-type in a silicone resin.

In an exemplary embodiment of the present invention, R2 of Chemical Formula 1 may be a vinyl group, an acrylate group or a methacrylate group, but is not limited thereto.

In an exemplary embodiment of the present invention, R3 to R7 of Chemical Formulae 2 and 3 may be each independently hydrogen or an alkyl group, but are not limited thereto.

In the first copolymer, a weight ratio of the first unit represented by Chemical Formula 1: the second represented by Chemical Formula 2: the third unit represented by Chemical Formula 3 may be (1 to 30):(5 to 80):(1 to 30) and (5 to 15):(10 to 50):(5 to 15), but is not limited thereto.

The first copolymer may have a weight average molecular weight of 100 to 1,000,000 and 1,000 to 50,000, but the weight average molecular weight is not limited thereto.

The content of the first copolymer may be 5 to 60 wt % and 15 to 50 wt % based on a total weight of the composition for an encapsulant, but is not limited thereto.

In the present invention, the second copolymer is characterized by comprising the second unit represented by Chemical Formula 2 and the third unit represented by Chemical Formula 3. The second copolymer may be a D-type silicone-based resin.

In the second copolymer, a weight ratio of the second unit represented by Chemical Formula 2: the third unit represented by Chemical Formula 3 may be 1:1 to 100:1, 1:1 to 10:1, and 3:1 to 7:1, but is not limited thereto.

The second copolymer may have a weight average molecular weight of 100 to 1,000,000 and 1,000 to 50,000, but the weight average molecular weight is not limited thereto.

The content of the second copolymer may be 5 to 60 wt % and 15 to 50 wt % based on the total weight of the composition for an encapsulant, but is not limited thereto.

An exemplary embodiment of the present invention is characterized in that a suitable strength of an encapsulant thin film may be obtained and the sensitivity may be improved during a curing process of an encapsulant composition, by applying both the first copolymer and the second copolymer.

In the present invention, the first copolymer and the second copolymer may be each independently a random copolymer.

In the present invention, the photoinitiator is thermally inactive, but generates free radicals when exposed to chemical rays. Examples of the photoinitiator comprise a substituted or unsubstituted polynuclear quinone, which is a compound having two intra-cyclic carbon atoms among the conjugated carbon cyclic compounds, for example, 2-benzyl-2-(dimethylamino)-1-(4-morpholino phenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(benza) anthracene-7,12-dione, 2,3-naphthacene-5,12-dione, 2-methyl-1,4-naphthoquinone, 1,4-dimethyl anthraquinone, 2,3-dimethyl anthraquinone, 2-phenyl anthraquinone, 2,3-diphenyl anthraquinone, retenquinone, 7,8,9,10-tetrahydronaphthracene-5,12-dione, and 1,2,3,4-tetrahydrobenz (tetrahydrobenza)-anthracene-7,12-dione, but are not limited thereto.

The content of the photoinitiator may be 0.1 to 10 wt % based on the total weight of the composition for an encapsulant, but is not limited thereto.

When the content of the photoinitiator is less than 0.1 wt % based on the total weight of the composition for an encapsulant, there may occur a problem in that even though strong ultraviolet rays are irradiated thereon, curing does not proceed due to a small number of active radicals which promotes the curing, and when the content exceeds 10 wt %, there is concern in that a service life of an organic light emitting device may be shortened because outgas sing occurs under the temperature conditions of less than 100° C. after the curing.

In an exemplary embodiment of the present invention, the reactive silicone-based oligomer may be represented by the following Chemical Formula 4.

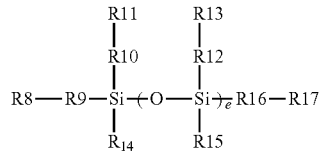

[Chemical Formula 4]

In Chemical Formula 4,

R9, R10, R12, and R16 are the same as or different from each other, and are each independently a direct bond or an alkylene group, R8, R11, R13, R14, R15, and R17 are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and e is 1 to 100.

In an exemplary embodiment of the present invention, the reactive silicone-based oligomer may have a weight average molecular weight of 100 to 15,000, but the weight average molecular weight is not limited thereto.

In an exemplary embodiment of the present invention, R11 and R13 of Chemical Formula 4 may be each independently a vinyl group, an acrylate group or a methacrylate group, but are not limited thereto.

In an exemplary embodiment of the present invention, R8, R14, R15, and R17 of Chemical Formula 4 may be each independently hydrogen or an alkyl group, but are not limited thereto.

In an exemplary embodiment of the present invention, Chemical Formula 4 may be represented by the following Chemical Formula 5.

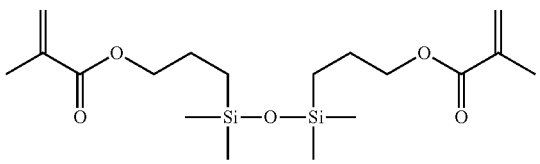

[Chemical Formula 5]

In an exemplary embodiment of the present invention, the reactive silicone-based oligomer may serve to adjust the surface leveling of an encapsulant of a composition for an encapsulant.

The content of the reactive silicone-based oligomer may be 5 to 40 wt % based on the total weight of the composition for an encapsulant, but is not limited thereto.

In an exemplary embodiment of the present invention, the silicone acrylate-based compound may be represented by the following Chemical Formula 6.

[Chemical Formula 6]

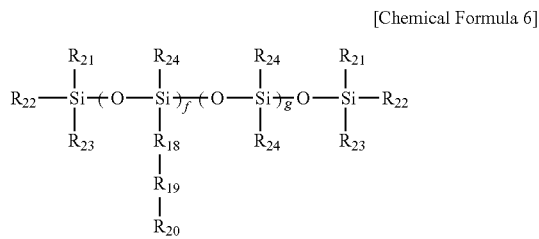

In Chemical Formula 6, $R_{18}$ is each independently a direct bond, or an alkylene group, and $R_{19}$ is benzene, or a cyclohexane group, $R_{20}$, $R_{21}$, $R_{22}$, $R_{23}$, and $R_{24}$ are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and f and g are each 0 to 100.

Specific examples of the silicone acrylate-based compound comprise methacryloxymethyl-bis-trimethylsiloxymethylsilane, methacryloxymethyldimethylethoxysilane, methacryloxymethylphenyldimethylsilane, methacryloxypropyltrisethoxysilane, methacryloxytrimethylsilane, methacryloxytrimethylsilane, methacryloxypropyltris trimethylsiloxy silane, and the like, but are not limited thereto.

The content of the silicone acrylate-based compound may be 1 to 50 wt % based on the total weight of the composition for an encapsulant, but is not limited thereto.

The composition for an encapsulant according to an exemplary embodiment of the present invention may additionally comprise a monomer known in the art in order to adjust a curing speed of the silicone resin material. Specific examples of the monomer comprise an acrylate-based monomer, a methacrylate-based monomer, a siloxane-based monomer, and the like, but are not limited thereto.

Examples of the monomer comprise triethylolpropane ethoxy triacrylate, t-butyl (meth)acrylate, 1,5-pentanediol di(meth)acrylate, N,N-diethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, pentaerythritol tri(meth)acrylate, polyoxyethylated trimethylolpropane tri(meth)acrylate, 2,2-di-(p-hydroxyphenyl)propane diacrylate, pentaerythritol tetra(meth)acrylatelate, 2,2-di-(p-hydroxyphenyl)propane dimethacrylate, triethylene glycol diacrylate, polyoxyethyl-2,2-di-(p-hydroxyphenyl)propane dimethacrylate, di-(3-methacryloxy-3-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol di(meth)acrylate, 1,2,4-butanetriol tri(meth)acrylate, 2,2,4-trimethyl-1,3-pentanediol di(meth)acrylate, 1-phenylethylene-1,2-dimethacrylate, diallyl fumarate, styrene, 1,4-benzenediol dimethacrylate, 1,4-diisopropenyl benzene, 1,3,5-triisopropenyl benzene, a silicone-based monomer, a silicone acrylate-based monomer, a silicone urethane-based monomer, and the like, but are not limited thereto.

In addition, the composition for an encapsulant according to an exemplary embodiment of the present application may comprise one or more additives such as a curing catalyst, a viscosity adjusting agent, a curing agent, a dispersing agent, a stabilizer, and a curing promoter depending on the use thereof. These additives may be used either alone or in mixture of two or more thereof.

Furthermore, an encapsulant according to an exemplary embodiment of the present invention is characterized by using the composition for an encapsulant. More specifically, the encapsulant according to an exemplary embodiment of the present invention may comprise: 1) a first copolymer comprising the first unit represented by Chemical Formula 1, the second unit represented by Chemical Formula 2, and the third unit represented by Chemical Formula 3; 2) a second copolymer comprising the second unit represented by Chemical Formula 2 and the third unit represented by Chemical Formula 3; 3) one or more photoinitiators; 4) a reactive silicone-based oligomer; and 5) a silicone acrylate-based compound.

In the encapsulant according to an exemplary embodiment of the present invention, the contents on the first copolymer, the second copolymer, the photoinitiator, the reactive silicone-based oligomer, the silicone acrylate-based compound, and the like are the same as those described above, and thus the specific description thereof will be omitted.

The encapsulant according to an exemplary embodiment of the present invention may be formed by using a method known in the art, except that the above-described composition for an encapsulant is used. More specifically, the encapsulant may be formed by using a method of applying, coating, or printing the composition for an encapsulant on a substrate, but the method is not limited thereto.

The composition for an encapsulant according to an exemplary embodiment of the present invention is characterized in that it is possible to manufacture an encapsulant which may improve a service life of an organic electronic device and effectively block oxygen and moisture and the like, which are introduced from the outside. Further, it is possible to obtain high sensitivity even at low energy during UV curing by comprising both D-type and T-type silicone resins in a first copolymer, and simultaneously comprising a silicone acrylate-based compound. In particular, since a low modulus may be implemented after curing, the composition for an encapsulant is characterized in that it is possible to obtain a cured product having both flexibility and strength, which can be applied to a flexible display.

The encapsulant according to an exemplary embodiment of the present invention may be applied to those which encapsulate and protect various objects. In particular, the encapsulant may be effective for protecting an object comprising a device which is sensitive to an external component, for example, moisture and humidity. Examples of the object to which the encapsulant may be applied comprise: a photovoltaic device, a rectifier, a transmitter, or an organic electronic device such as an organic light emitting diode (OLED); a solar cell; or a secondary battery, and the like, but are not limited thereto.

For an object to which the encapsulant according to an exemplary embodiment of the present invention is applied, an inorganic protective layer and the encapsulant of the present invention may be multi-layered to seal the device. The inorganic protective layer and the encapsulant of the present invention may be alternately stacked, but the stacking is not limited thereto. The inorganic protective layer means an inorganic protective layer deposited by a vacuum process such as sputtering, evaporation, sublimation, chemical vapor deposition, metal organic chemical vapor deposition, and a combination thereof.

Furthermore, the encapsulant reduces the possibility that the residues remain inside a sealed structure by minimizing outgases resulting from byproducts produced in a curing process or unreacted residues in a curing initiator, and the encapsulant exhibits excellent transparency, and as a result, the encapsulant may be formed as a stable encapsulant regardless of the type of organic electronic device such as top emission or bottom emission.

The organic electronic device may be provided with a typical configuration known in the art, except that an encapsulant is formed of the above-described materials. For example, it is possible to use glass, metal or a polymer film, and the like, which are typically used in the art, as a lower or upper substrate. Furthermore, the organic electronic device may comprise, for example, a pair of electrodes and an organic material layer formed between the pair of electrodes. Here, one of the pair of electrodes may be formed of a transparent electrode. Further, the organic material layer may comprise, for example, a hole transporting layer, a light emitting layer, an electron transporting layer, and the like.

MODE FOR INVENTION

Hereinafter, the present specification will be described in more detail through Examples. However, the following Examples are provided only for exemplifying the present specification, but are not intended to limit the present specification.

EXAMPLES

Synthesis Example 1

150 g of TSL8370 (manufactured by Momentive Inc.), 1,250 g of TSL8032 (manufactured by Momentive Inc.), 65 g of TSL8031 (manufactured by Momentive Inc.), and 1,600 g of toluene were put into and stirred well in a 5,000 ml three-necked round flask, and then 100 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, and the resulting mixture was warmed to 120° C. and stirred for 2 hours. Water was completely removed from the final silicone polymer layer, thereby obtaining a first copolymer.

As a result of measuring the molecular weight by GPC, a weight average molecular weight of 5,000 g/mol was measured by polystyrene standard.

Synthesis Example 2

450 g of TSL8032 (manufactured by Momentive Inc.), 100 g of TSL8031 (manufactured by Momentive Inc.), and 1,200 g of toluene were put into and stirred well in a 5,000 ml three-necked round flask, and then 120 g of water was added dropwise thereto at room temperature, and the resulting mixture was stirred for about 1 hour.

After the stirring, 700 g of water was additionally added thereto, and then the temperature was increased to 70° C., and the resulting mixture was stirred for 2 hours. After the stirring was completed, the silicone layer and the aqueous layer were separated, the aqueous layer was discarded, and the silicone polymer layer was left behind.

The silicone polymer layer was heated to 80° C., and then 0.5 g of a KOH solution diluted to 50% was put thereinto, the resulting mixture was warmed to 120° C. and stirred for 2 hours, and then a final product was obtained.

Water was completely removed from the silicone polymer layer, thereby obtaining a second copolymer.

As a result of measuring the molecular weight by GPC, a weight average molecular weight of 1,600 g/mol was measured by polystyrene standard.

Synthesis Example 3

1,500 g of 1,1,1,3,5,5,5-heptamethyl 3-beta-(3,4-epoxy cyclohexyl) ethyl trisiloxane, 1,000 g of toluene, and 6 g of titanium isopropoxide were put into and stirred well in a 5,000 ml three-necked round flask.

Thereafter, the temperature was increased to 90° C., and the mixture was stirred for 8 hours while adding 300 g of acrylic acid dropwise thereto. After the stirring was completed, 30 g of silica (Rhodia MicroPearl Zeosil 1165 MP) was added thereto, and the resulting mixture was further stirred at room temperature for 2 hours.

After the stirring, the silica was removed by filtering the mixture with a filter. And then, stripping was performed in a vacuum state to remove all the toluene, and then a silicone acrylate compound A was obtained.

Example 1

38 g of the first copolymer obtained in Synthesis Example 1, 34 g of the second copolymer obtained in Synthesis Example 2, 19 g of a silicone-based oligomer having the structure of Chemical Formula 5 (TSL9706 manufactured by Momentive Inc.), 5 g of the silicone acrylate compound A obtained in Synthesis Example 3, and 4 g of a photoinitiator (TPO) manufactured by BASF AG were stirred well in a glass vial, thereby obtaining a silicone photosensitive resin composition.

Example 2

29 g of the first copolymer obtained in Synthesis Example 1, 34 g of the second copolymer obtained in Synthesis Example 2, 19 g of a silicone-based oligomer having the structure of Chemical Formula 5 (TSL9706 manufactured by Momentive Inc.), 14 g of the silicone acrylate compound A obtained in Synthesis Example 3, and 4 g of a photoinitiator (TPO) manufactured by BASF AG were stirred well in a glass vial, thereby obtaining a silicone photosensitive resin composition.

Example 3

24 g of the first copolymer obtained in Synthesis Example 1, 19 g of the second copolymer obtained in Synthesis Example 2, 19 g of a silicone-based oligomer having the structure of Chemical Formula 5 (TSL9706 manufactured by Momentive Inc.), 34 g of the silicone acrylate compound A obtained in Synthesis Example 3, and 4 g of a photoinitiator (TPO) manufactured by BASF AG were stirred well in a glass vial, thereby obtaining a silicone photosensitive resin composition.

Comparative Example 1

96 g of the first copolymer obtained in Synthesis Example 1 and 4 g of a photoinitiator (TPO) manufactured by BASF AG were stirred well in a glass vial, thereby obtaining a silicone photosensitive resin composition.

Comparative Example 2

96 g of the second copolymer obtained in Synthesis Example 2 and 4 g of a photoinitiator (TPO) manufactured by BASF AG were stirred well in a glass vial, thereby obtaining a silicone photosensitive resin composition.

Comparative Example 3

96 g of a silicone-based oligomer having the structure of Chemical Formula 5 (TSL9706 manufactured by Momentive Inc.) and 4 g of a photoinitiator (TPO) manufactured by BASF AG were stirred well in a glass vial, thereby obtaining a silicone photosensitive resin composition.

Comparative Example 4

38 g of the first copolymer obtained in Synthesis Example 1, 29 g of the second copolymer obtained in Synthesis Example 2, 29 g of a silicone-based oligomer having the structure of Chemical Formula 5 (TSL9706 manufactured by Momentive Inc.), and 4 g of a photoinitiator (TPO) manufactured by BASF AG were stirred well in a glass vial, thereby obtaining a silicone photosensitive resin composition.

TABLE 1

|  | First copolymer | Second copolymer | Reactive silicone-based oligomer | Silicone acrylate compound A | Photo-initiator (TPO) |
|---|---|---|---|---|---|
| Example 1 | 38 | 34 | 19 | 5 | 4 |
| Example 2 | 29 | 34 | 19 | 14 | 4 |
| Example 3 | 24 | 19 | 19 | 34 | 4 |
| Comparative Example 1 | 96 | 0 | 0 | 0 | 4 |
| Comparative Example 2 | 0 | 96 | 0 | 0 | 4 |
| Comparative Example 3 | 0 | 0 | 96 | 0 | 4 |
| Comparative Example 4 | 38 | 29 | 29 | 0 | 4 |

Characteristics of the compositions prepared in Examples 1 to 3 and Comparative Examples 1 to 4 were evaluated, and the evaluation results are shown in the following Table 2.

TABLE 2

|  | Example 1 | Example 2 | Example 3 | Comparative Example 1 | Comparative Example 2 | Comparative Example 3 | Comparative Example 4 |
|---|---|---|---|---|---|---|---|
| Adhesion test after curing | Cured | Cured | Cured | Cured | Uncured | Cured | Cured |
| Photocuring rate | 96.70% | 98.40% | 99.10% | 92.20% | 17.4% | 67.2% | 94.70% |
| Storage Modulus (@25° C., Mpa) | 204 | 178 | 135 | 870 | Impossible to manufacture test specimen | 930 | 830 |
| Outgas (ppm) after curing | <100 ppm | <100 ppm | <100 ppm | >500 ppm | >1000 ppm | >500 ppm | >500 ppm |

Experimental Example

1) Adhesion Test after Curing

A silicone photosensitive resin composition of the present invention was applied to have a suitable thickness, for example, a thickness of 4 to 40 μm on a substrate subjected to a predetermined pre-treatment by using a method such as a spin or coating method, a roll coating method, a screen printing method, and an applicator method, and then the applied surface was covered with the same substrate. And then, the substrate was irradiated with the energy of 1 J at an i-line wavelength of 395 nm. As a light source used for the irradiation, a low-pressure mercury lamp, a high-pressure mercury lamp, a super high-pressure mercury lamp, a metal halide lamp, an argon gas laser, and the like may be used, and in some cases, an X-ray, an electron ray, and the like may also be used.

Whether the composition was cured or uncured was determined according to whether the substrate was pushed out when pushing the upper substrate by applying a certain force after the substrate was irradiated with the energy. When the upper substrate was pushed out and thus separated from the lower substrate, it was determined that the composition was uncured, and when the upper substrate was firmly fixed and was not pushed out, it was determined that the composition was cured.

2) Photocuring Rate (UV Curing Conversion %)

The photocuring rate was confirmed by using FT-IR (IR-Prestige21, manufactured by Shimadzu Corp.). A thin film was applied to have a thickness of 5 μm onto a film which does not absorb light at all and has a transmittance of 100%, and then the surface thereof was covered with the same film. A test specimen thus obtained was subjected to FT-IR analysis before the test specimen was cured and after the sample was irradiated with 1 J (@395 nm LED wavelength) and with 5 J (@395 nm LED wavelength) to measure the transmittance (%) intensity of the transmission peak around 1,635 cm$^{-1}$ (C=C). The photocuring rate was calculated according to the following Equation 1.

$$[(B-A)/(C-A)] \times 100 \quad \text{[Equation 1]}$$

In Equation 1,

A is a transmittance (%) around 1,635 cm$^{-1}$ (C=C) before the curing, B is a transmittance (%) around 1,635 cm$^{-1}$ (C=C) after the curing at 1 J, and C is a transmittance (%) around 1,635 cm$^{-1}$ (C=C) after the curing at 5 J.

When the photocuring rate is low, a large amount of uncured residue is produced, which is responsible for generating a large amount of outgas of the coating film.

3) Storage Modulus

A storage modulus (at 25° C., Mpa) was confirmed by using DMA (Q800 manufactured by TA Instruments). A mold with width 5.3 mm×length 17.7672 mm×height 2 mm was filled with a sample, and then the sample was irradiated with UV 1J (@395 nm LED wavelength), thereby manufacturing a test specimen.

The thus-prepared test specimen was analyzed at a temperature rising rate of 3° C. per minute from −40° C. to 80° C. by using DMA, thereby obtaining a storage modulus. Among the storage moduli, the storage value at 25° C. was taken.

4) Outgas

The outgas was sampled through a pyrolyzer and analyzed by using GC/MS. The outgas was obtained by performing an analysis under the conditions of a pyrolyzer temperature of 100° C. and a GC oven temperature of 300° C.

The sampling of the sample to be analyzed was analyzed by thin-film applying the composition to a thickness of 5 μm, performing UV curing under a nitrogen atmosphere, and obtaining a material after the curing. The exposure was performed with an energy of 1 J at 395 nm.

As described above, the composition for an encapsulant according to an exemplary embodiment of the present invention is characterized in that it is possible to prepare an encapsulant which may improve a service life of an organic electronic device, and effectively block oxygen and moisture and the like, which are introduced from the outside.

Further, the composition for an encapsulant according to an exemplary embodiment of the present invention has a characteristic of improving the sensitivity of an encapsulant using the composition for an encapsulant by introducing a novel organopolysilicone-based resin such as a first copolymer.

In particular, the composition for an encapsulant according to an exemplary embodiment of the present invention may obtain high sensitivity even at low energy during UV curing by comprising both D-type and T-type silicone resins in a first copolymer, and simultaneously comprising a silicone acrylate-based compound. In particular, since a low modulus may be implemented after curing, the composition for an encapsulant is characterized in that it is possible to obtain a cured product having both flexibility and strength, which can be applied to a flexible display.

The invention claimed is:

1. A composition for an encapsulant, the composition comprising:
   1) a first copolymer comprising a first unit represented by the following Chemical Formula 1, a second unit represented by the following Chemical Formula 2, and a third unit represented by the following Chemical Formula 3;
   2) a second copolymer comprising the second unit represented by the following Chemical Formula 2 and the third unit represented by the following Chemical Formula 3;
   3) one or more photoinitiators;
   4) a reactive silicone-based oligomer; and
   5) a silicone acrylate-based compound:

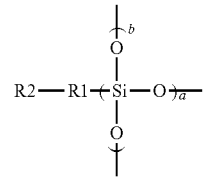

[Chemical Formula 1]

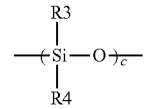

[Chemical Formula 2]

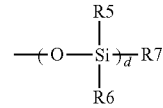

[Chemical Formula 3]

in Chemical Formulae 1 to 3,

R1 is a direct bond, or an alkylene group,

R2 to R7 are the same as or different from each other, and are optionally each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, c, and d are each independently 1 to 200.

2. The composition of claim 1, wherein R2 of Chemical Formula 1 is a vinyl group, an acrylate group, or a methacrylate group.

3. The composition of claim 1, wherein R3 to R7 of Chemical Formulae 2 and 3 are each independently hydrogen or an alkyl group.

4. The composition of claim 1, wherein in the first copolymer, a weight ratio of the first unit represented by Chemical Formula 1: the second unit represented by Chemical Formula 2: the third unit represented by Chemical Formula 3 is (1 to 30):(5 to 80):(1 to 30).

5. The composition of claim 1, wherein in the second copolymer, a weight ratio of the second unit represented by Chemical Formula 2: the third unit represented by Chemical Formula 3 is 1:1 to 100:1.

6. The composition of claim 1, wherein the reactive silicone-based oligomer is represented by the following Chemical Formula 4:

[Chemical Formula 4]

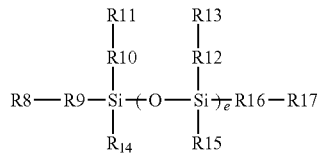

in Chemical Formula 4,

R9, R10, R12, and R16 are the same as or different from each other, and are each independently a direct bond or an alkylene group, R8, R11, R13, R14, R15, and R17 are the same as or different from each other, and are each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and e is 1 to 100.

7. The composition of claim 6, wherein Chemical Formula 4 is represented by the following Chemical Formula 5:

[Chemical Formula 5]

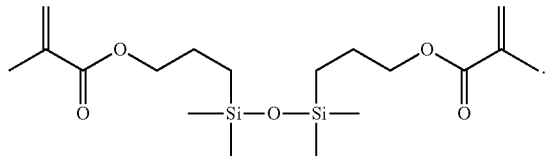

8. The composition of claim 1, wherein the silicone acrylate-based compound is represented by the following Chemical Formula 6:

[Chemical Formula 6]

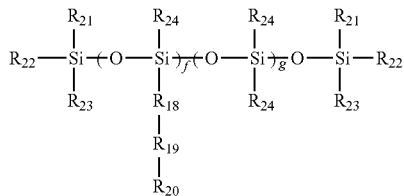

in Chemical Formula 6, $R_{18}$ is each independently a direct bond, or an alkylene group, and $R_{19}$ is benzene, or a cyclohexane group, $R_{20}$, $R_{21}$, $R_{22}$, $R_{23}$, and $R_{24}$ are the same as or different from each other, and are each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and f and g are each 0 to 100.

9. The composition of claim 1, wherein the silicone acrylate-based compound comprises one or more selected from methacryloxymethyl-bis-trimethylsiloxymethylsilane, methacryloxymethyldimethylethoxysilane, methacryloxymethylphenyldimethylsilane, methacryloxypropyltrisethoxysilane, methacryloxytrimethylsilane, methacryloxytrimethylsilane, and methacryloxypropyltris trimethylsiloxy silane.

10. The composition of claim 1, wherein based on a total weight of the composition for an encapsulant, a content of the first copolymer is 20 to 90 wt %, a content of the second copolymer is 1 to 70 wt %, a content of the reactive silicone-based oligomer is 5 to 40 wt %, a content of the silicone acrylate-based compound is 1 to 50 wt %, and a content of the photoinitiator is 0.1 to 10 wt %.

11. An encapsulant formed by using the composition for an encapsulant according to claim 1.

12. An organic electronic device comprising the encapsulant according to claim 11.

* * * * *